United States Patent [19]

Bohlen et al.

[11] 4,426,584

[45] Jan. 17, 1984

[54] METHOD OF COMPENSATING THE PROXIMITY EFFECT IN ELECTRON BEAM PROJECTION SYSTEMS

[75] Inventors: Harald Bohlen, Boeblingen; Helmut Engelke, Altdorf; Johann Greschner, Pliezhausen; Peter Nehmiz, Stuttgart, all of Fed. Rep. of Germany

[73] Assignee: International Business Machines Corporation, Armonk, N.Y.

[21] Appl. No.: 270,086

[22] Filed: Jun. 3, 1981

[30] Foreign Application Priority Data

Jul. 10, 1980 [EP] European Pat. Off. ........ 80103966.0

[51] Int. Cl.³ .............................................. H01J 3/26
[52] U.S. Cl. .................................. 250/492.2; 430/296
[58] Field of Search ................. 250/492.2, 398, 491.1; 430/296, 312

[56] References Cited

U.S. PATENT DOCUMENTS

| | | | |
|---|---|---|---|
| 4,169,230 | 9/1979 | Bohlen et al. | 250/492.2 |
| 4,198,569 | 4/1980 | Takayama | 250/396 ML |
| 4,234,358 | 11/1980 | Celler et al. | 250/492.2 |
| 4,264,711 | 4/1981 | Greeneich | 430/296 |

OTHER PUBLICATIONS

M. Parikh, "Proximity Effect Corrections In Electron Beam Lithography", J. Vac. Sci. Techn. 15, 382–391 (1978).

N. Sugiyama et al. "Advanced EB Proximity Effect Correction For Fine-Pattern Device Fabrication". J. Elec. Chem. Soc. Extended Abstracts 80-1, 663–666 (1980).

Primary Examiner—Bruce C. Anderson
Attorney, Agent, or Firm—T. Rao Coca

[57] ABSTRACT

For compensating scattering losses of electrons in photoresists (proximity effect) which influence electron beam lithography by altering the pattern geometry it is suggested to expose selected partial areas of a pattern to an additional irradiation dosage in a second exposure step. For that purpose, a specific mask with corresponding correction openings can be used which is applied with the same, or with a different electron beam intensity. In a particularly advantageous manner the correction of the proximity effect can be achieved when complementary masks are used; the correction openings for the partial areas of the one complementary mask are arranged in the other complementary mask. The proximity effect is then corrected without an additional exposure step. For measuring the proximity effect a photo-optical process is suggested where line patterns with decreasing ridge width in the photoresist are defined through electron beam projection, and where the developing process of the photoresist is discontinued prematurely. The ridge edges which in the presence of the proximity effect are asymmetrical can be easily detected under the microscope.

4 Claims, 22 Drawing Figures

METHOD OF COMPENSATING THE PROXIMITY EFFECT IN ELECTRON BEAM PROJECTION SYSTEMS

BACKGROUND OF THE INVENTION

The invention relates to a method of compensating the proximity effect in the imaging of patterns in electron beam projection systems.

In the production of integrated circuits, the reduction of manufacturing costs and increase of operating speed demand structures of continuously decreasing size. Conductive lines with a width of 1 micrometer and less can no longer be resolved by means of present-day photolithographic methods.

Although in principle lithographic processes with electron beams permit a much higher resolution in the transfer of patterns, there actually exist considerable difficulties due to scattering effects of the electrons in the radiation sensitive (photoresist) layer to be exposed, and in the substrate. This negative effect is called the proximity effect.

With the generally used electron beam energy of about 25 keV, the electron range in the photoresist and in the substrate is approximately 5 $\mu$m before being decelerated through collisions with atoms and electrons. This causes a lateral scattering of the impinging electrons by approximately that amount, and consequently a considerable blurring of the patterns transferred.

The effects of such scattering is shown in FIG. 1. FIG. 1A represents an insulated pattern element A in a photoresist layer 1; this pattern element can, e.g., be generated through the raster-like illumination with a fine electron beam, or through the projection of a corresponding mask opening with an electron beam of a greater diameter. The electrons impinging in area A are partly absorbed there; another part (represented by arrows), however, migrates outside area A and is thus lost for the exposure of the photoresist in area A. For compensating these scattering losses area A is therefore to be given a higher irradiation dose.

However, the higher irradiation dose to be applied depends on the immediate surroundings of the respective pattern element. If two pattern elements are closely adjacent, e. g., areas B1 and C in FIG. 1B, each element emits scattering electrons to the neighbouring element from which it also receives scattering electrons. Therefore the overall dose received in each of elements B1 and C is higher than in an isolated element B2.

For correcting the proximity effect it had therefore been suggested to subject the individual partial areas of the pattern to electron beams of differing intensity, and to determine the respective dosage in such manner that scattering electrons of other adjacent pattern elements are taken into consideration. A corresponding method is described in the article by Mihir Parikh, "Proximity Effect Corrections in Electron Beam Lithography", in J. Vac. Sci. Techn., Vol. 15, No. 3, 1978, pp. 382–391. To determine the respective irradiation dosage demands, however, extensive arithmetic operations (in a computer); furthermore, a local change of the irradiation dosage can be effected in an electron beam exposure system only where the electron beam is guided as a fine pen over the respective surface to be exposed (raster or vector scan principle).

However, electron beam exposure systems with raster-like beam deflection need long exposure times and are therefore of restricted use only for an economic semiconductor production. Electron beam projection systems where an exposure mask is imaged through an expanded electron beam following the shadow projection principle do not have this disadvantage, but such systems do not permit a local change of the exposure dosage, and consequently no compensation of the proximity effect. The practical use of electron beam projection systems for making highly integrated circuits is therefore questionable. For that reason it has been suggested to disregard an electron beam projection exposure, and to use instead ion beams where owing to the higher ion mass scattering effects play a very minor part only. However, such ion systems are more complex with regard to beam generation and control.

Another way of compensating the proximity effect which in principle would also be applicable to electron beam projection systems consists in exposing the individual pattern elements not in their nominal dimensions but in using an exposure area larger than the respective pattern element. In the development of the photoresist the proximity effect causes a shrinkage to the respective nominal dimensions.

To fix the exact dimensions of the area to be exposed considering the future shrinkage is, however, highly complicated for intricate patterns, and it can no longer be executed with automatic calculation methods. Consequently this method cannot be applied as a practical means for production; a correction of the proximity effect can under these circumstances only be performed by a variation of the irradiation dosage.

It is therefore an object of the present invention to provide a quickly realizable method for compensating the proximity effect that can be used in electron beam projection systems. Furthermore, a measuring method for the proximity effect is to be given which is easy to apply.

SUMMARY OF THE INVENTION

For compensating the proximity effect the invention suggests to give to the individual pattern elements the respective local irradiation dosage required in consideration of the proximity effect in two or more exposure steps, each with the same dosage but with different masks. This multiple exposure of selected pattern elements can be easily carried out with so-called complementary masks in that additional mask openings for pattern areas of the one mask are respectively provided in the associated complementary mask.

By means of the method according to the invention and using correspondingly modified complementary masks the resolution of the electron beam projection can be improved for structures of down to 0.5 $\mu$m. This only involves one single determination of form and arrangement of the additional openings in the complementary masks. For a detailed examination of the consequences of the proximity effect, and for measuring the additional openings a correspondingly sensitive and at the same time uncomplicated measuring method is given. It suggests to expose the radiation sensitive (photoresist) layer with predetermined fine structures, and to discontinue the development process prematurely in order to obtain data on sub-etching owing to the proximity effect.

BRIEF DESCRIPTION OF THE DRAWINGS

Below, embodiments of the invention will be described with reference to the drawings.

The drawings show the following.

DETAILED DESCRIPTION OF THE INVENTION

The general method for compensating the proximity effect in electron beam projection systems consists in dividing a complex exposure pattern into individual partial patterns, and to determine for each partial pattern the additional exposure (electron beam dosage) required to compensate the proximity effect. This additional irradiation dosage depends on the respective surroundings of each partial pattern. Depending on the irradiation dosage found, and on the form of the partial pattern an opening in an exposure mask is defined with which the partial pattern is exposed for a second time, with an electron beam of the intensity of the initial exposure.

Figure 1B:
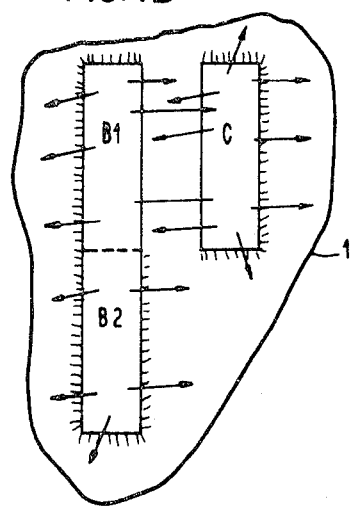
FIG. 1 in part FIG. 1A to FIG. 1B a schematic representation of the consequences of the proximity effect.
Figure 1A:
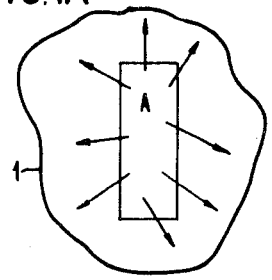
Figure 2:
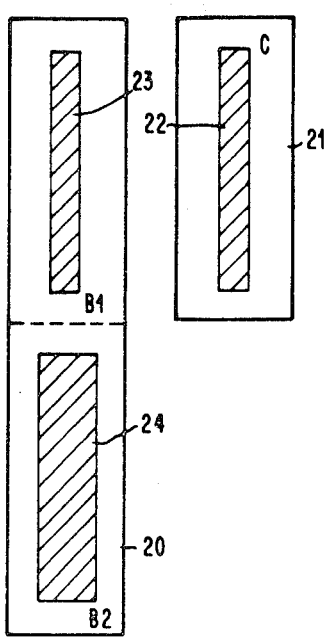
FIG. 2 a basic representation regarding the compensation of the proximity effect through the multiple exposure of pattern elements.

FIG. 2 shows this method with an example of an exposure pattern as described in connection with FIG. 1. The longitudinal partial pattern 20 is split into two areas B1, B2, with B1 being provided opposite partial pattern C, reference number 21. Partial patterns B1 and C each receive scattering electrons of the other partial pattern, and for compensating the proximity effect they therefore require only a relatively small additional exposure dosage; this additional dosage is supplied by means of a second exposure in the hatched areas 22, 23. Isolated partial pattern B2 receives no (or less) scattering electrons of other partial patterns so that the total irradiation dosage available for its exposure is clearly less than in partial patterns B1 and C. The additional exposure for compensating the proximity effect is therefore to be effected with a higher dosage; accordingly, (hatched) area 24 applied in the second exposure is larger than in partial patterns B1 and C. The exact size and the exact position of the hatched areas of second exposure has to be precisely determined for each individual case, taking into consideration all losses and contributions of the proximity effect for each partial pattern. This can be calculated (with algorithms or tables for standard patterns), or it can be effected in experiments by measuring the respectively required additional dosage. A measuring method for the proximity effect will be described in detail below.

Figure 3A:
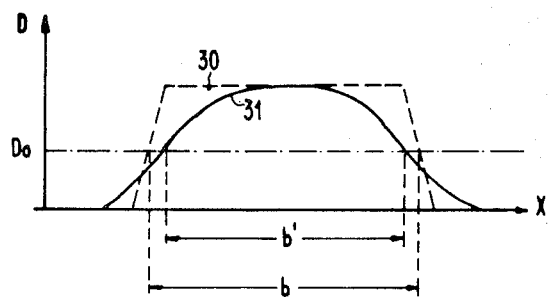
FIG. 3 in part FIGS. 3A to 3C cross-sections through thin photoresist structures or profiles of the irradiation dosage to explain the proximity effect and its compensation.

The consequences of the proximity effect, and of the additional correction exposure onto a ridge-shaped profile in the photoresist are represented in FIG. 3. In FIG. 3A, irradiation dosage (D) is given over a local coordinate (X); dashed line 30 represents the distribution of the irradiation dosage when there is no electron scattering in the photoresist; solid line 31 represents the case with electron scattering. The minimum dosage required for exposing the photoresist is assumed to have value $D_O$; the line width in the developed photoresist is obtained from the intersection of dosage distribution and minimum dosage $D_O$. FIG. 3A shows that width b, which results in the case without scattering (corresponding to the respective nominal width) is not reached when there are scattering effects, but only a reduced width b'.

Figure 3B:
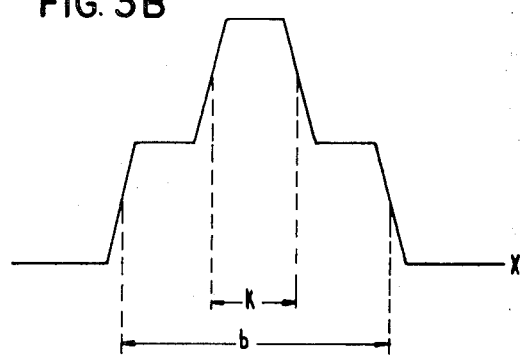

For compensating this proximity effect, the invention suggests to use instead of a distribution of the irradiation dosage according to line 30, an intensity profile in accordance with FIG. 3B; within the desired line width b, an additional exposure (electron irradiation) is provided in an area k, e.g., with a second exposure mask with openings of width k. (The trapezoid shape of the dosage curve instead of the theoretically expected vertical limitations is due to inevitable electron-optical effects).

Figure 3C:
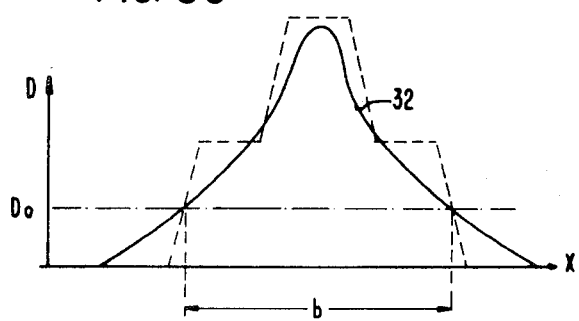

The resulting exposure profile of the two superimposed exposures is shown in FIG. 3C at reference number 32. This curve intersects the horizontal of minimum exposure $D_O$ at the respective points of intersection so that after the exposure of the photoresist nominal width b is obtained.

The double exposure for correcting the proximity effect can, e.g., be carried out in a second exposure step, with an exposure mask having openings corresponding to the double exposure patterns.

Such a second exposure step suitable for proximity effect correction only is avoided in connection with complementary masks as described in applicants' German Pat. No. 27 39 502 corresponding to U.S. Pat. No. 4,169,230. Owing to the strong interactions of electrons and matter, the mask patterns in electron beam projection systems cannot be provided on a "transparent" substrate; instead, the mask openings are preferably real holes in the mask. However, isolated pattern elements cannot be made in this manner since they do not have a support. This problem can be solved through the superposition of two complementary masks in that the isolated structure is divided into suitably formed and supported partial structures.

The above described correction of the proximity effect can in complementary masks be achieved as a by-product without any additional exposure step. After the division of the mask pattern into two complementary masks the respective additional correction exposure is determined for each partial pattern thus formed, and a corresponding opening is made in the other complementary mask.

Figure 4A:
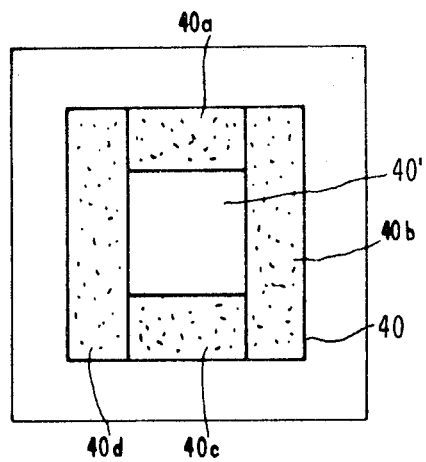
FIG. 4 in part FIG. 4A a pattern element with isolated island, and in part FIGS. 4B, 4C complementary exposure masks for making a pattern element with island structure.
Figure 4B:
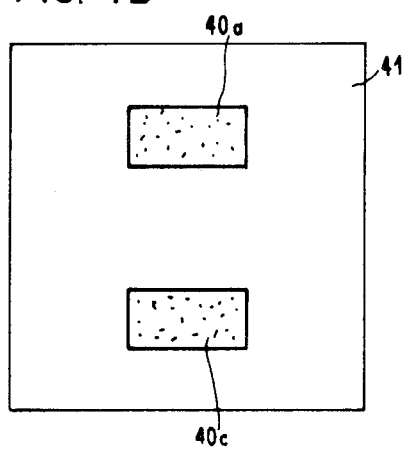
Figure 4C:
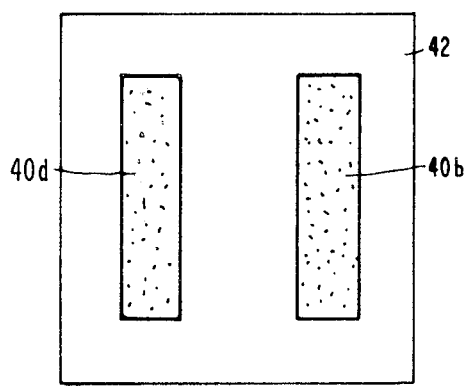

The principle of complementary masks is shown schematically in FIG. 4; dotted ring 40 is to be exposed, centerpiece 41' is not to be exposed. For forming complementary masks A and B, ring 40 is divided into four partial areas 40a to 40d, and two respective of these partial areas (40a, 40c, 40b, 40d, respectively) are arranged on an exposure mask (B and/or C). Through the superposition of the two masks B, C the annular exposure area 40 is obtained without there being any mechanical stability problems for center area 41'.

Figure 5A:
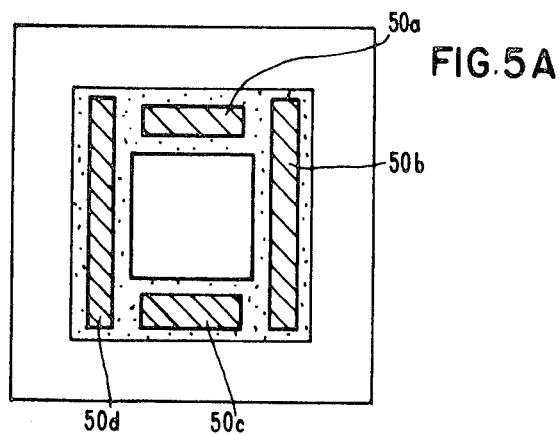
FIG. 5 in part FIG. 5A, a pattern element with island structure, and data on the partial patterns that are to receive double exposure for the compensation of the proximity effect.
FIGS. 5B, 5C position of the areas of double exposure in the complementary exposure masks in accordance with FIGS. 4B, 4C.
FIGS. 5D, 5E complementary exposure masks in accordance with FIGS. 4B, 4C with additional mask openings each corresponding to the double exposure sectors of the other complementary mask.

For correcting the proximity effect in the annular exposure area of FIG. 4A, double exposures are necessary in those areas which in FIG. 5A are hatched, and marked with reference numbers 50a to 50d.

Figure 5B:
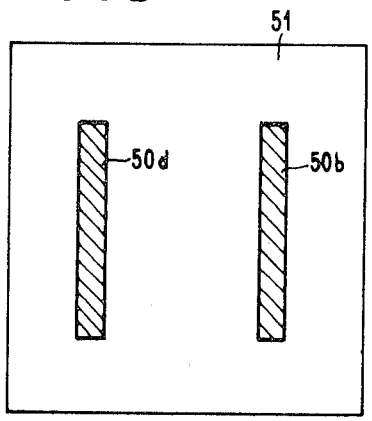
Figure 5C:
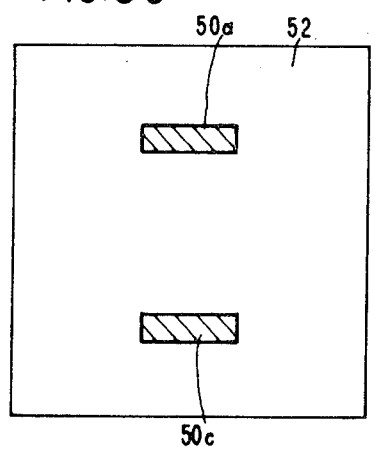

FIGS. 5B and 5C represent correction masks that may be used when for each complementary mask an additional exposure step would be carried out to correct the proximity effect. The correction mask with reference number 51 in FIG. 5B, and with apertures 50b, 50d is provided to correct complementary mask 42 with areas 40b, 40d, and accordingly correction mask 52 in FIG. 5C with apertures 50a, 50c to correct complementary mask 41 with areas 40a, 40c. These additional correction masks, however, are not necessary when the correction mask for a complementary mask is integrated in the respective other complementary mask.

Figure 5D:
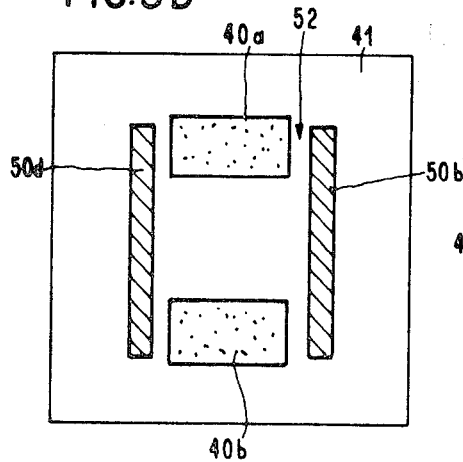
Figure 5E:
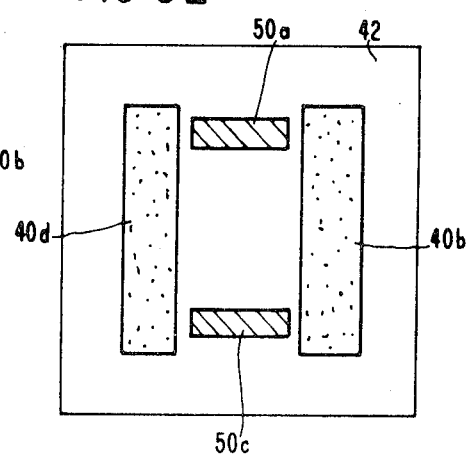

The combinations of complementary and correction masks are shown in FIGS. 5D and 5E. Complementary mask 41 thus comprises correction or compensating openings 50b, 50d for complementary mask 42, and vice versa complementary mask 42 comprises correction or compensating openings 50a, 50c for complementary mask 41. By superimposing the two supplemented masks 41, 42 in FIGS. 5D and 5E, FIG. 5A with the respective areas of double exposure is obtained.

To ensure the mechanical stability of the masks in accordance with FIGS. 5E and 5D the correction openings have to be slightly smaller than the associated exposure openings.

In masks 41, 42 of FIGS. 5D, 5E between the actual exposure openings (e.g. 40a) and correction openings (e.g. 50b), there consequently remain sufficient ridges to separate these partial patterns. Ridge widths of 0.3 to 0.4 $\mu$m will be enough for the mask stability.

In the method of compensating the proximity effect with two exposure steps of the same intensity, as described here, a partial pattern can receive as correction dosage only once more the dosage used for the initial exposure (i.e., when the opening of the correction mask corresponds to the opening of the partial pattern). This restriction of the applicable correction exposure is most evident in isolated pattern elements (e.g. small squares), and it restricts the application of the method to patterns with a maximum resolution of 0.5 $\mu$m. With even smaller dimensions of the structure to be imaged the losses through the proximity effect are greater than the maximum applicable correction irratiation. In that case, compensation would have to involve the additional exposure with higher intensity and/or another separate mask.

The exact determination of position and form of the double exposure pattern part requires the precise measuring of the range of the proximity effect. Below, a method will be described permitting a direct measuring of this scope. According to this method, a test pattern is imaged on a radiation sensitive (photoresist) layer and developed which consists of several groups of lines of equal width but where from group to group there is a slight increase of line width (approximately $\frac{1}{8}$ $\mu$m).

The ratio of line width d to the range of the proximity effect in the photoresist determines the shape of the line edges after the photoresist development.

FIG. 6 is a schematic representation of the influence of the proximity effect on edge profiles. FIG. 6 uses as a test object an extended photoresist area 60 with an edge 61, as well as a ridge 62 with edges 63 and 64 and a width d. Owing to the proximity effect edge 61 receives a back-scattering dosage on one side only (from exposed area 65); the dosage at edge 63, on the other hand, depends on whether width d of the ridge is bigger or smaller than the range of the proximity effect. In the latter case, e.g. with a smaller width, edge 63 receives scattering electrons from exposed area 65 as well as from exposed area 66. Therefore the profile of edge 63 will alter, compared with the profile of edge 61 as soon as thickness d adopts a value that is comparable with the range of the proximity effect.

Figure 6A:
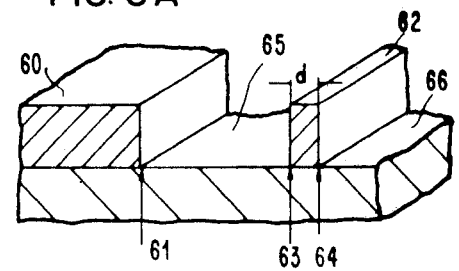
FIG. 6 in part FIGS. 6A, 6C the cross-section through a photoresist profile after a 100% and 70% developing period respectively when there is no proximity effect; in part FIGS. 6B, 6D the cross-section through a photoresist profile after a 100% and 70% development period respectively, when there is a proximity effect.
Figure 6B:
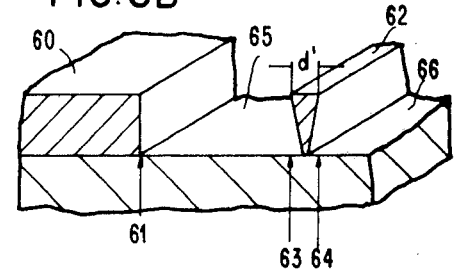

FIG. 6A represents the situation after a full development of the photoresist when width d is greater than the proximity effect. FIG. 6B shows a ridge with width d' smaller than the proximity effect range; after a full development of the photoresist there is "sub-etching" at edges 63 and 64 owing to the proximity effect.

Distinguishing the various edge profiles can in principle be effected photomicroscopically, or with a scanning electron microscope (which latter case would involve the destroying of the sample). To distinguish various profiles in the limit zone (i.e., line width d $\lesssim$ range of the proximity effect) is, however, very complicated as there are only minor deviations or only a small asymmetry of edges 61 and 63, 64.

For an easier detection of the profiles, particularly in photomicroscopic observation it is therefore suggested not to develop fully the above-mentioned exposed line pattern in the usual manner, but to discontinue the developing process prematurely, e.g., after approximately 70 to 80% of the full developing time.

Figure 6C:
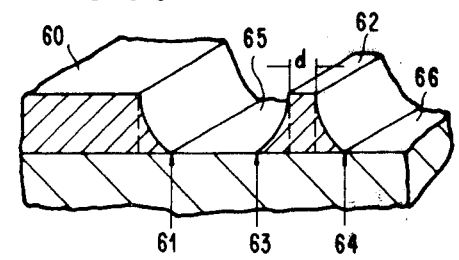
Figure 6D:
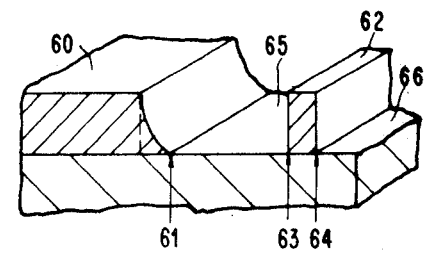

Instead of the profile in FIG. 6A there will be a profile of the type shown in FIG. 6C and instead of the profile of FIG. 6B the profile according to FIG. 6D will be obtained.

The distinguishing of the profiles between 6C and 6D can now be made photomicroscopically much more easily and clearly than that of the profiles according to FIGS. 6A, B. Any changes of edge profile 63 owing to the proximity effect can be easily ascertained in that the symmetry in profiles 61 and 63 is compared. If with a decreasing ridge width d a deviation in the symmetry of the two edges appears for the first time this ridge width corresponds to the range of the proximity effect. Since asymmetries in the edge profile are very easily found by optical means this method of interrupted development represents a direct and quick measuring of the range of the proximity effect.

In FIG. 7 the two evaluation methods for line test patterns are compared. The microscopic photographs 7A and 7B represent test objects where developing had been interrupted after 70% of the developing period. Partial FIGS. 7C and 7D represent the same test patterns after a 100% development. The exposed and etched areas are marked 70 to 79.

Figure 7A:
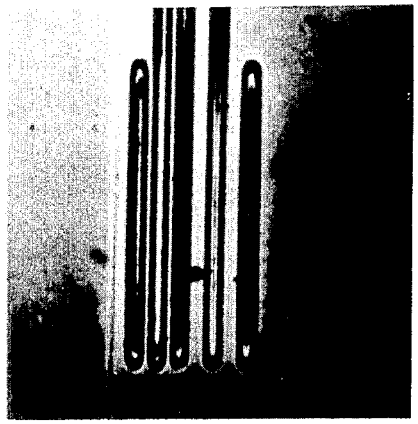
FIG. 7 in part FIGS. 7A to 7D photo-optical images of a test pattern showing lines of increasing width, taken at different times of the developing process.
Figure 7B:
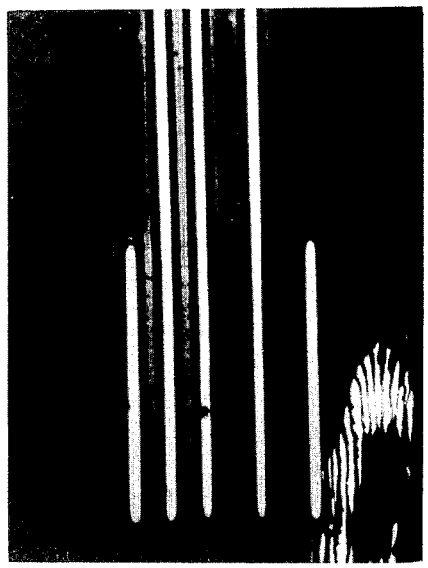

In FIG. 7A, ridge width d is smaller than the range of the proximity effect. Consequently, the left and right edges of etched area 70 are asymmetrical so that there appears another thin line at the left edge of area 70. In FIG. 7B width d precisely corresponds to the range of the proximity effect so that in the stepwise widening of ridge width d both edges of area 70 appear symmetrical for the first time.

Figure 7C:
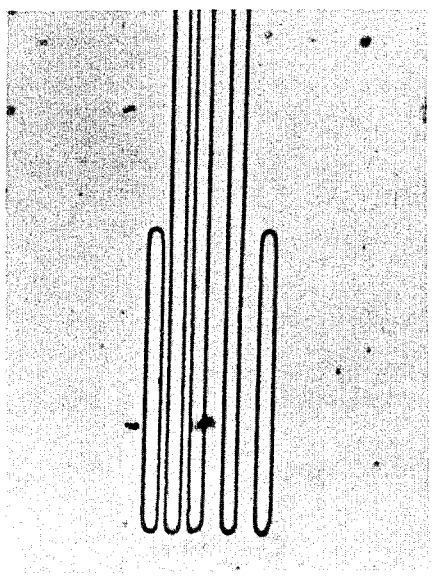
Figure 7D:
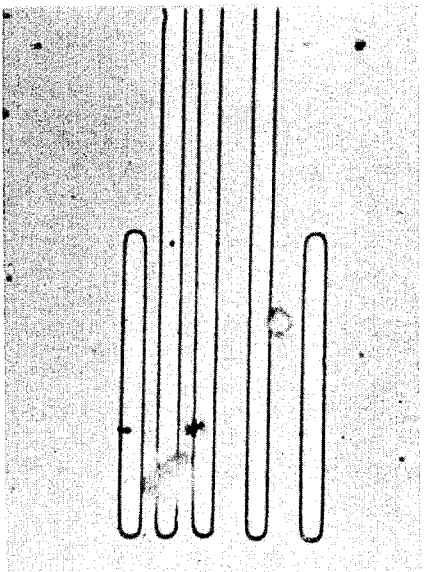

FIG. 7C corresponds to FIG. 7A after a 100% development, FIG. 7D corresponds to FIG. 7B after a 100% development. In both FIGS. 7C and 7D it is very difficult if not impossible to find any differences caused by the proximity effect, for an edge sub-etching is scarcely noticeable optically.

While the invention has been particularly shown and described with reference to the preferred embodiments thereof, it will be understood by those skilled in the art that various changes in form and detail may be made therein without departing from the spirit and scope of the invention.

What is claimed is:

1. A method of compensating the proximity effect in the imaging of patterns in electron beam projection systems comprising the steps of:
   (a) performing an initial electron beam exposure of a radiation sensitive layer in predetermined pattern areas through an exposure mask having openings in correspondence with said pattern areas; and
   (b) subjecting selected exposed pattern areas which require compensation for loss of electron beam due to scattering during said initial exposure to at least one additional electron beam exposure through a correction mask having openings in correspondence with said selected exposed pattern areas and of a dimension smaller than the corresponding openings in said exposure mask
   whereby said predetermined pattern areas receive a uniform total electron beam exposure and the proximity effect due to scattering loss of electrons during the initial exposure is compensated.

2. The method as defined in claim 1 wherein said additional electron beam exposure is carried out at the same beam intensity as the initial exposure.

3. A method of compensating the proximity effect in the imaging of a predetermined pattern in electron beam projection systems comprising the steps of:
   (a) dividing said pattern into first and second patterns;
   (b) performing an initial electron beam exposure of a radiation sensitive layer through a first mask having exposure openings in correspondence with said first partial pattern and compensating openings in correspondence with said second partial pattern;
   (c) subjecting said exposed partial patterns to an additional electron beam exposure through a second mask having exposure openings in correspondence with said second partial pattern and compensating openings in correspondence with said first partial pattern
   whereby the proximity effect due to scattering loss of electrons during exposure through the exposure openings is compensated and the total electron beam exposure is rendered uniform in all of said pattern.

4. The method of claim 3 wherein the compensating openings in said first and second mask are in at least in one dimension slightly smaller than the corresponding exposure openings in the second and first mask, respectively.

* * * * *